United States Patent
Kochi

(10) Patent No.: US 7,592,575 B2
(45) Date of Patent: Sep. 22, 2009

(54) PHOTOELECTRIC CONVERSION DEVICE HAVING PLURAL PIXEL COLUMNS AND INDEPENDENT READOUT WIRING, MULTICHIP IMAGE SENSOR, CONTACT IMAGE SENSOR, AND IMAGE SCANNER

(75) Inventor: Testsunobu Kochi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 53 days.

(21) Appl. No.: 11/275,675

(22) Filed: Jan. 24, 2006

(65) Prior Publication Data
US 2006/0169871 A1 Aug. 3, 2006

(30) Foreign Application Priority Data
Jan. 28, 2005 (JP) ............... 2005-021448

(51) Int. Cl.
*H01L 27/00* (2006.01)
(52) U.S. Cl. ............ 250/208.1; 250/214.1; 348/302; 348/320
(58) Field of Classification Search ........ 250/208.1, 250/214 R, 214.1, 214 DC; 348/230.1, 294, 348/300, 301, 302, 307, 308, 320, 322; 359/512, 359/513, 514
See application file for complete search history.

(56) References Cited

U.S. PATENT DOCUMENTS

| | | | | |
|---|---|---|---|---|
| 6,181,442 B1 * | 1/2001 | Ogura et al. | ............... | 358/475 |
| 6,188,094 B1 | 2/2001 | Kochi et al. | ............... | 257/232 |
| 6,473,538 B2 | 10/2002 | Kozuka | ............... | 382/312 |
| 6,605,850 B1 | 8/2003 | Kochi et al. | ............... | 257/431 |
| 6,661,459 B1 | 12/2003 | Koizumi et al. | ............. | 348/310 |
| 6,670,990 B1 | 12/2003 | Kochi et al. | ............... | 348/310 |
| 6,717,151 B2 * | 4/2004 | Tashiro et al. | .......... | 250/370.11 |
| 6,800,836 B2 | 10/2004 | Hamamoto et al. | ...... | 250/208.1 |
| 6,946,637 B2 | 9/2005 | Kochi et al. | ............... | 250/208.1 |
| 7,016,089 B2 | 3/2006 | Yoneda et al. | ............. | 358/482 |
| 7,091,466 B2 * | 8/2006 | Bock | ........................ | 250/208.1 |
| 7,110,030 B1 | 9/2006 | Kochi et al. | ............... | 348/308 |
| 7,129,458 B2 | 10/2006 | Hamamoto et al. | ...... | 250/208.1 |
| 7,135,668 B2 | 11/2006 | Kochi et al. | ............. | 250/214 R |
| 2002/0044699 A1 | 4/2002 | Kozuka | ...................... | 382/312 |
| 2004/0017496 A1 | 1/2004 | Koizumi et al. | ............. | 348/308 |

(Continued)

FOREIGN PATENT DOCUMENTS

JP 11-234472 8/1999

(Continued)

*Primary Examiner*—Thanh X Luu
*Assistant Examiner*—Francis M Legasse, Jr.
(74) *Attorney, Agent, or Firm*—Fitzpatrick, Cella, Harper & Scinto

(57) ABSTRACT

The invention provides a photoelectric conversion device, in which a decrease in sensitivity and a crosstalk between wirings are suppressed. Plural pixel columns are arranged in one direction, plural pixels are arranged in a different direction to the one direction in a column manner in the pixel column, and the pixel includes a photodiode PD, a reset transistor M4 for resetting the photodiode PD, and a source follower input transistor M3 for receiving a signal from the photodiode PD. An independent readout wiring 16 is individually provided for each pixel. The reset transistor M4 and the source follower input transistor M3 included in one pixel column or another pixel column are arranged between the photodiode column in one pixel column and the photodiode column in another pixel column arranged adjacent to the one pixel column.

8 Claims, 13 Drawing Sheets

U.S. PATENT DOCUMENTS

| | | | |
|---|---|---|---|
| 2004/0135064 A1* | 7/2004 | Mabuchi | 250/208.1 |
| 2004/0141077 A1* | 7/2004 | Ohkawa | 348/308 |
| 2005/0006676 A1 | 1/2005 | Watanabe | 257/290 |
| 2005/0185074 A1 | 8/2005 | Yoneda et al. | 348/294 |
| 2005/0206763 A1 | 9/2005 | Kochi et al. | 348/302 |
| 2006/0197006 A1 | 9/2006 | Kochi | 250/208.1 |

FOREIGN PATENT DOCUMENTS

| | | |
|---|---|---|
| JP | 11-274454 | 10/1999 |
| JP | 2004-342836 | 12/2004 |

* cited by examiner

PHOTOELECTRIC CONVERSION DEVICE HAVING PLURAL PIXEL COLUMNS AND INDEPENDENT READOUT WIRING, MULTICHIP IMAGE SENSOR, CONTACT IMAGE SENSOR, AND IMAGE SCANNER

BACKGROUND OF THE INVENTION

1. Field of the Invention

The present invention relates to a photoelectric conversion device in which plural pixel columns, in which plural pixels are arrayed, are arranged and an independent readout wiring is individually provided for each pixel. The invention also relates to a multichip module type image sensor, a contact image sensor, and an image scanner on which the plural photoelectric conversion devices are mounted.

2. Related Background Art

Recently, in an information processing field, in contrast to the conventional scaling-system line sensor in which an optical system is used, the same-magnification system contact image sensor on which plural image sensor chips are multichip-mounted is actively developed as the line image scanner.

For example, Japanese Patent Application Laid-Open No. H11-234472 discloses a structure of the contact image sensor in which the image sensor chips having one-line light receiving element arrays are multichip-mounted. FIG. 6 is an equivalent circuit diagram showing a color image sensor in which a three-line light receiving element array is formed by the image sensor chips having one-line light receiving element arrays disclosed in Japanese Patent Application Laid-Open No. H11-234472.

Referring to FIG. 6, image sensor chips 1 and 1' which are of the photoelectric conversion device are multi-mounted, and a clock CLK for driving each image sensor chip and a start pulse SP are input to each image sensor chip. The image sensor chips 1 and 1' include N-bit delay means (N-bit pre-shift register) 2 and 2', readout circuit blocks 3 and 3' including K-by-3-bit shift registers 11 and 11', K-bit-by-3-column light receiving element arrays (three pixel columns) 4 and 4', timing generation circuits 5 and 5', and signal output amplifiers 6 and 6'.

The signals, located N bits (K-N bits) ahead when the readout of the bits of each image sensor chip is ended, are output from the portions located N bits ahead from the final register of the shift registers 11 and 11' as the start signal of the next chip in next chip start signals SD and SD'.

The timing generation circuits 5 and 5' driven by the clock signal CLK and the start pulse signal SP generate pulses for driving the light receiving element arrays 4 and 4' and pulses φ1 and φ2 for driving the shift register 11 and 11'. The pulse φ1 is output to drive lines 7 and 7', and the pulse φ2 is output to drive lines 8 and 8'. The reason why the start pulse signal SP is commonly output to the image sensor chips is that the operation start of each image sensor chip is synchronized.

Each of the signal output amplifiers 6 and 6' amplifies an image signal, which is read out onto one signal output line through a switch turned on and off by each sift signal of the shift registers 11 and 11'. The amplified image signals are output as signals Vout by controls signals of the timing generation circuits 5 and 5'. The signal output amplifiers 6 and 6' includes constant current circuits therein. The constant current circuits start supply of power source at the same time when the start signal is input, and the constant current circuits enables a normal amplifying operation to be performed when the N-bit clock signals are input from the start signal.

FIG. 7 is a timing chart showing the drive pulses φ1 and φ2 of the shift register 11 for the clock signal CLK.

FIG. 7 is the timing chart when the delay means 2 shown in FIG. 6 is set at four bits. Therefore, the shift registers 11 and 11' start the first shift register operation while delayed by four bits from the start pulse signal SP.

As shown in FIG. 7, the drive pulses φ1 of the shift registers 11 and 11' are synchronized with a high level of the clock signal CLK, and the drive pulses φ2 are synchronized with a low level of the clock signal CLK. The signal output Vout is taken out in synchronization with the drive pulses φ1 and φ2. Therefore, when the first bit of the shift register 11 corresponds to the drive pulse φ1, odd-number bits are the signal output synchronized with the drive pulse φ1, and even-number bits are the signal output synchronized with the drive pulse φ2.

In FIG. 7, the reference sign SA denotes a signal output of the image sensor chip 1, and the reference sign SC denotes a signal output of the image sensor chip 1'. Therefore, the whole signal output Vout is obtained as shown in FIG. 7. Each image sensor chip outputs the signal, located four bits ahead from the final bit, as the start signal SB of the next image sensor chip.

Thus, a large-size original can directly be read as the multichip module type image sensor, and a read rest time between the chips and a difference in signal output level can be eliminated.

FIG. 8 is an equivalent circuit diagram showing the readout circuit block 3 and light receiving element 4 (only two-pixel-by-three-column light receiving element is shown) shown in FIG. 6. Light receiving elements (constituting the pixel) r1 to b2 include photodiodes PDr1 to PDb2 which are of the photoelectric conversion element. For example, red (RED), green (GREEN), and blue (BLUE) color filters are arranged on each photodiode column.

The readout circuit block 3 includes readout switches M1b1, M1r1, ..., and M1g2, signal transfer switches M2b1, M2r1, ..., and M2g2, MOS source follower input transistors M3b1, M3r1, ..., and M3g2, MOS source follower constant current loads CSb1, CSr1, ..., and CSg2, reset switches M4b1, M4r1, and M4g2 which are of means for resetting the photodiodes PDr1 to PDb2, storage capacitances CAPb1, CAPr1, ..., and CAPg2 in which capacitances are temporarily stored, a shift register 11, a common output line 14, and a common output line reset switch 15. The light receiving elements r1 to b2 and the readout circuit block 3 are connected with readout wirings 16b1, 16r1, ..., and 16g2.

Photocarriers generated by the photoelectric conversion in the photodiodes PDr1 to PDb2 of the light receiving elements r1 to b2 shown in FIG. 8 are transmitted to MOS source follower input transistors through the readout wirings, and charge-voltage conversion is performed to the photocarriers. Then, the signal transfer pulse φT is changed to the high level to turn on all the signal transfer switches M2b1, M2r1, ..., and M2g2, and the light signals are collectively transferred to the storage capacitances CAPb1, CAPr1, ..., and CAPg2 in all the pixels. Then, the readout switches M1b1, M1r1, ..., and M1g2 are sequentially turned on by the readout pulses φSR1 to φSR6 sequentially turned to the high level from the shift register 11, and signal voltage is read out onto the common output line 14 while the capacitance is divided.

FIG. 9 is a schematic plan view showing the light receiving element 4 shown in FIG. 8. In FIG. 9, the signs RED, GREEN, and BLUE designate the red, green, and blue color filters formed on the photodiodes PDr1 to PDb2. A material such as dye or pigment is usually used for the color filter. The readout wirings 16r1 to 16b2 from PDs (hereinafter, each photodiode of the photodiodes PDr1 to PDb2 is referred to as PD) run between PDs to the readout circuit block 3 in order to obstruct incident light.

After the signals of the photodiodes PDr1 to PDb2 are collectively transferred to the storage capacitances CAPb1, CAPr1, . . . , and CAPg2, the signals are read out through the signal output amplifier 6 in the order of the signals corresponding to PDb1, PDr1, PDg1, PDb2, PDr2, and PDg2.

However, the following problems are generated when the pixels are arranged as shown in FIG. 9. Lengths of the readout wirings 16 connecting the photodiodes PD and the input transistors M3 differs from one another by at least a pixel pitch in the pixel columns (light receiving element arrays), which creates a difference in wiring capacitance associated with the readout wiring 16. The photocarrier generated by the photoelectric conversion in the photodiode PD is converted into the signal voltage by the capacitance associated with the photodiode PD. When the pixel columns differ from one another in the wiring capacitance of the readout wiring 16, there is the problem that a difference in sensitivity is generated in each pixel column. The total capacitance associated with the photodiode PD is increased by providing the readout wiring 16 to the readout circuit block 3, which results in the problem that the sensitivity is decreased.

As described with reference to FIG. 8, the following problems are generated when the signals from the pixel columns are read out at the same timing. As shown in FIG. 9, the readout wirings 16 connecting the photodiodes PD and the MOS source follower input transistors M3 are provided from the pixel columns to the readout circuit block 3 respectively. Therefore, a crosstalk is generated by a parasitic capacitance between the readout wirings 16 (for example, between the readout wiring 16g1 and 16b2), which leads to color mixture to generate the problem that image quality is remarkably decreased in the color image. This is the new problem which is not generated in the case of an area sensor. In the area sensor, a vertical shift register is provided in addition to a horizontal shift register corresponding to the shift register 11, and the signal is read out onto the common readout wiring (vertical signal line) provided in each pixel column by the vertical shift register while readout timing is changed. Accordingly, even if the readout wiring are arranged adjacent to each other like the readout wirings 16g1 and 16b2 of FIG. 9, because the pixel columns differ from each other, the signals are not simultaneously read out in the readout wirings 16g1 and 16b2, which generates no problem. However, in the case of the multichip module type image sensor, the vertical shift register cannot be arranged because the pixel column is arranged to an edge portion of the chip. Therefore, it is difficult to avoid the above problem.

The crosstalk problem is not limited to the sensor on which the color filter is mounted. Even in the mono-chrome image sensor chip and mono-chrome multichip module type image sensor on which the color filter is not mounted, sometimes the signals from the plural pixel columns (plural light receiving element arrays) are read out at the same time. Accordingly, when the wirings are arranged adjacent to each other, there is generated the problem that the generation of the crosstalk worsens image contrast.

SUMMARY OF THE INVENTION

In view of the foregoing, an object of the invention is to provide a photoelectric conversion device which suppresses the difference in sensitivity among the pixel columns and the decrease in sensitivity, caused by the capacitance associated with the photoelectric conversion device.

Another object of the invention is to provide a photoelectric conversion device in which the crosstalk between the wirings to eliminate the color mixture or to obtain the high-quality image without generating the decrease in contrast.

Still another object of the invention is to provide a photoelectric conversion device in which a signal fluctuation to the storage capacitance, caused by the fluctuation in wiring length, can be suppressed by keeping the wiring length constant between the source follower current source and the signal transfer transistor.

In order to solve the above problems, a photoelectric conversion device according to the invention is characterized in that a plurality of pixel columns each comprising a plurality of pixels being arranged in a column manner in one direction are arranged in the other direction different form the one direction, the pixel including a photoelectric conversion element, a reset transistor for resetting the photoelectric conversion element, and a source follower input transistor for receiving a signal from the photoelectric conversion element, an independent readout wiring is individually provided for each pixel, and the reset transistor and the source follower input transistor are arranged between the photoelectric conversion element column in one pixel column and the photoelectric conversion element column in another pixel column arranged adjacent to the one pixel column, the reset transistor and the source follower input transistor being included in one pixel column or another pixel column.

A photoelectric conversion device according to the invention is characterized in that a plurality of pixel columns each comprising a plurality of pixels being arranged in a column manner in one direction are arranged in the other direction different form the one direction, the pixel including a photoelectric conversion element, a transfer transistor for transferring a signal from the photoelectric conversion element, a floating diffusion portion for receiving the signal from the transfer transistor, a source follower input transistor connected to the floating diffusion portion, and a reset transistor for resetting at least the floating diffusion portion, an independent readout wiring is individually provided for each pixel, and the transfer transistor, the floating diffusion portion, the reset transistor, and the source follower input transistor are arranged between the photoelectric conversion element column in one pixel column and the photoelectric conversion element column in another pixel column arranged adjacent to the one pixel column, the transfer transistor, the floating diffusion portion, the reset transistor, and the source follower input transistor being included in one pixel column or another pixel column.

A photoelectric conversion device according to the invention includes a pixel area in which a plurality of pixel columns each comprising a plurality of pixels being arranged in a column manner in one direction are arranged in the other direction different form the one direction, the pixel including a photoelectric conversion element and a source follower input transistor for receiving a signal from the photoelectric conversion element; an independent readout wiring which is individually provided per each pixel; a signal transfer transistor which is connected to the readout wiring ; and a source follower current source which is connected to the readout wiring between the signal transfer transistor and the pixel area.

A multichip module type image sensor according to the invention includes the photoelectric conversion devices of the invention. An image scanner according to the invention includes a contact image sensor of the invention.

According to the invention, the difference in sensitivity caused by the difference in capacitance between the columns associated with the photodiode and the decrease in sensitivity can be suppressed.

According to the invention, the signal crosstalk can be prevented between the readout wirings to eliminate the color mixture or to obtain the high-quality image without generating the decrease in contrast.

According to the invention, a signal fluctuation to the storage capacitance caused by the fluctuation in wiring length can be suppressed by keeping the wiring length constant between the source follower current source and the signal transfer transistor.

DESCRIPTION OF THE PREFERRED EMBODIMENTS

Preferred embodiments of the invention will be described below with reference to the drawings.

First Embodiment

Figure 1:
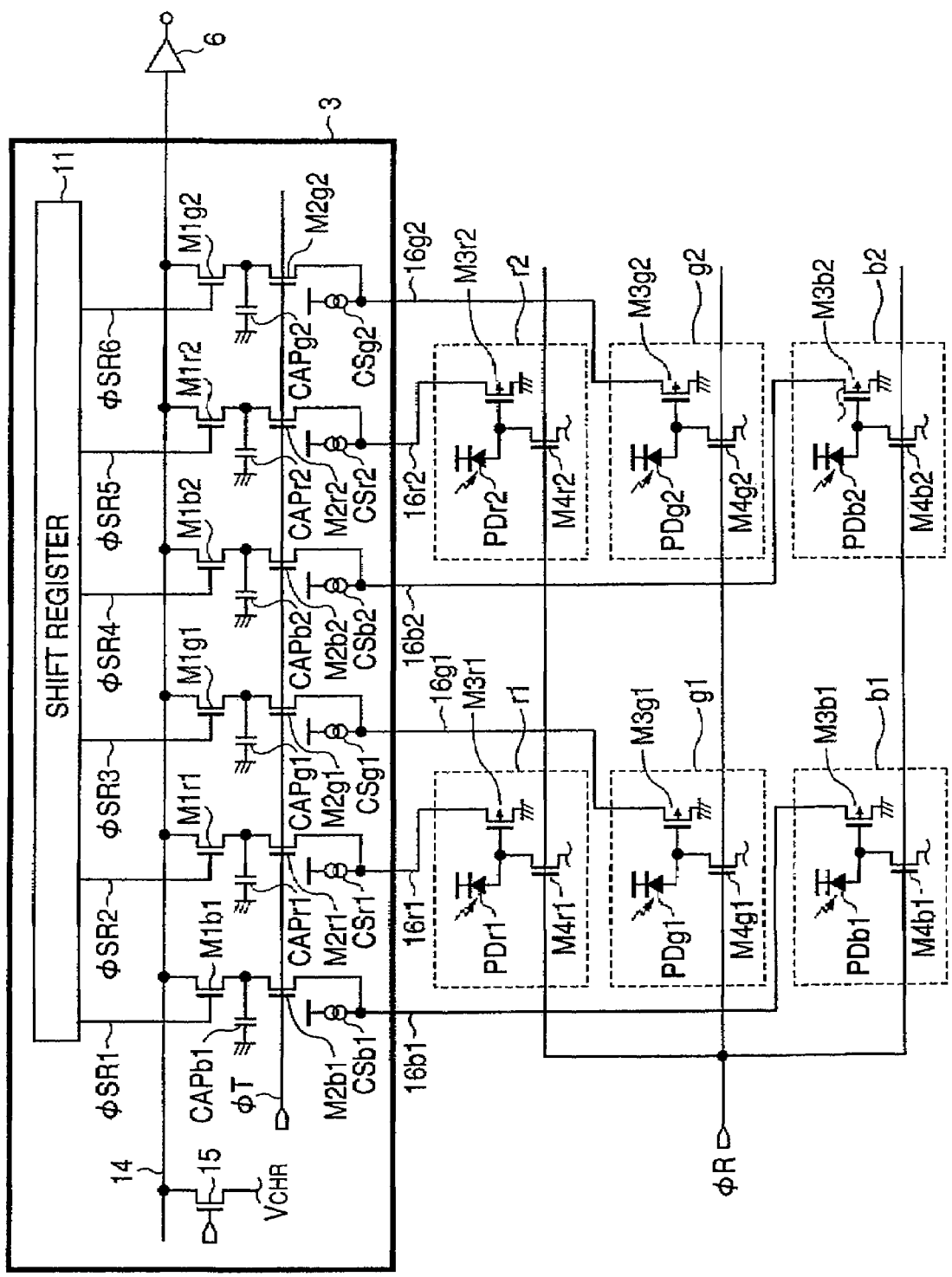
FIG. 1 is an equivalent circuit diagram showing a readout circuit block and a light receiving element according to a first embodiment of the invention.
Figure 8:
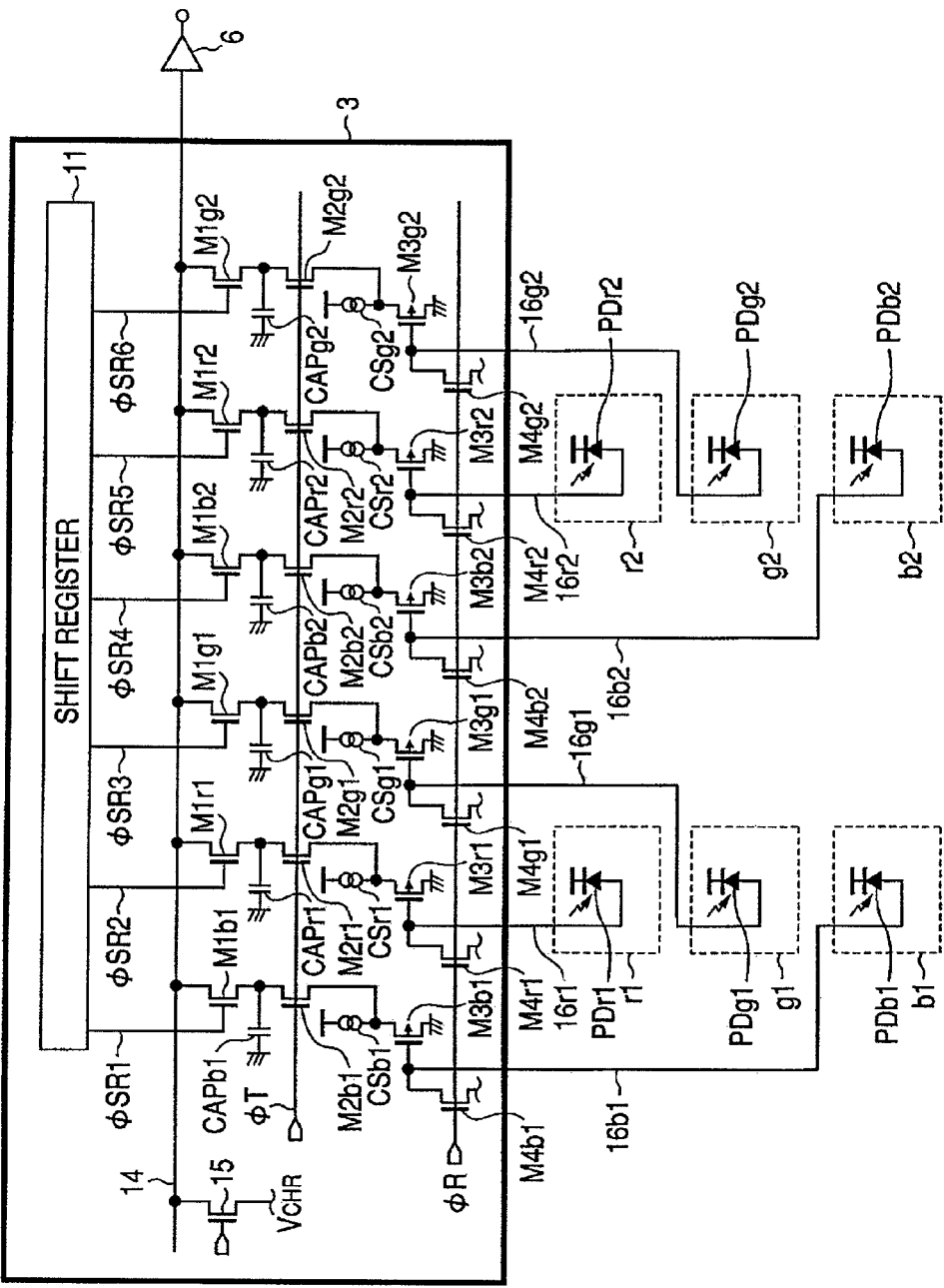
FIG. 8 is an equivalent circuit diagram showing a readout circuit block and a light receiving element in the related art.

FIG. 1 shows a configuration of a light receiving element according to a first embodiment of the invention. FIG. 1 shows an equivalent circuit corresponding to the readout circuit block 3 and light receiving element array 4 (only two-pixel-by-three-column light receiving element (three pixel columns) is shown) shown in FIG. 6. The equivalent circuit of the color image sensor in the first embodiment is similar to the equivalent circuit diagram shown in FIG. 6, and the configuration and the operation are already described, so that the description will be not repeated. In FIG. 1, the component similar to that of FIG. 8 is designated by the same reference numeral or sign.

Referring to FIG. 1, the light receiving elements (constituting the pixel) r1 to b2 include the photodiode PDr1 to PDb2 which are of the photoelectric conversion element, the MOS source follower input transistors M3r1 to M3b2, and the reset switches (reset transistors) M4r1 to M4b2 which are of the means for collectively resetting the photodiodes PDr1 to PDb2 with φR. An area where the light receiving elements (pixel) r1 to b2 are arranged (also including an area where the readout wiring between light receiving elements is arranged) is referred to as pixel area.

The readout circuit block 3 includes the readout switch M1b1, M1r1, . . . , and M1g2, the signal transfer switches (signal transfer transistors) M2b1, M2r1, . . . , and M2g2, the MOS source follower constant current loads (current sources) CSb1, CSr1, . . . , and CSg2, the storage capacitance CAPb1, CAPr1, . . . , and CAPg2 in which the capacitances are temporarily stored, the shift register 11, the common output line 14, and the common output line reset switch 15 which resets the common output line 14 at a predetermined potential VCHR. A reference value for determining a constant current value is easily set without variation by arranging the MOS source follower constant current loads (current sources) CSb1, CSr1, . . . , and CSg2 outside the pixel area in a column manner. The wiring lengths can be kept constant between the constant current loads CSb1, CSr1, . . . , and CSg2 and the signal transfer switches M2b1, M2r1, . . . , and M2g2. The signal is written in the storage capacitances CAPb1, CAPr1, . . . , and CAPg2 by charge and discharge from the MOS source follower constant current load (current source) or the MOS source follower input transistor according to magnitude of the signal. Accordingly, the constant interconnect lengths between the constant current loads and the signal transfer switches enable the suppression of the signal fluctuation to the storage capacitance, which is caused by the fluctuation in interconnect length.

Figure 13:
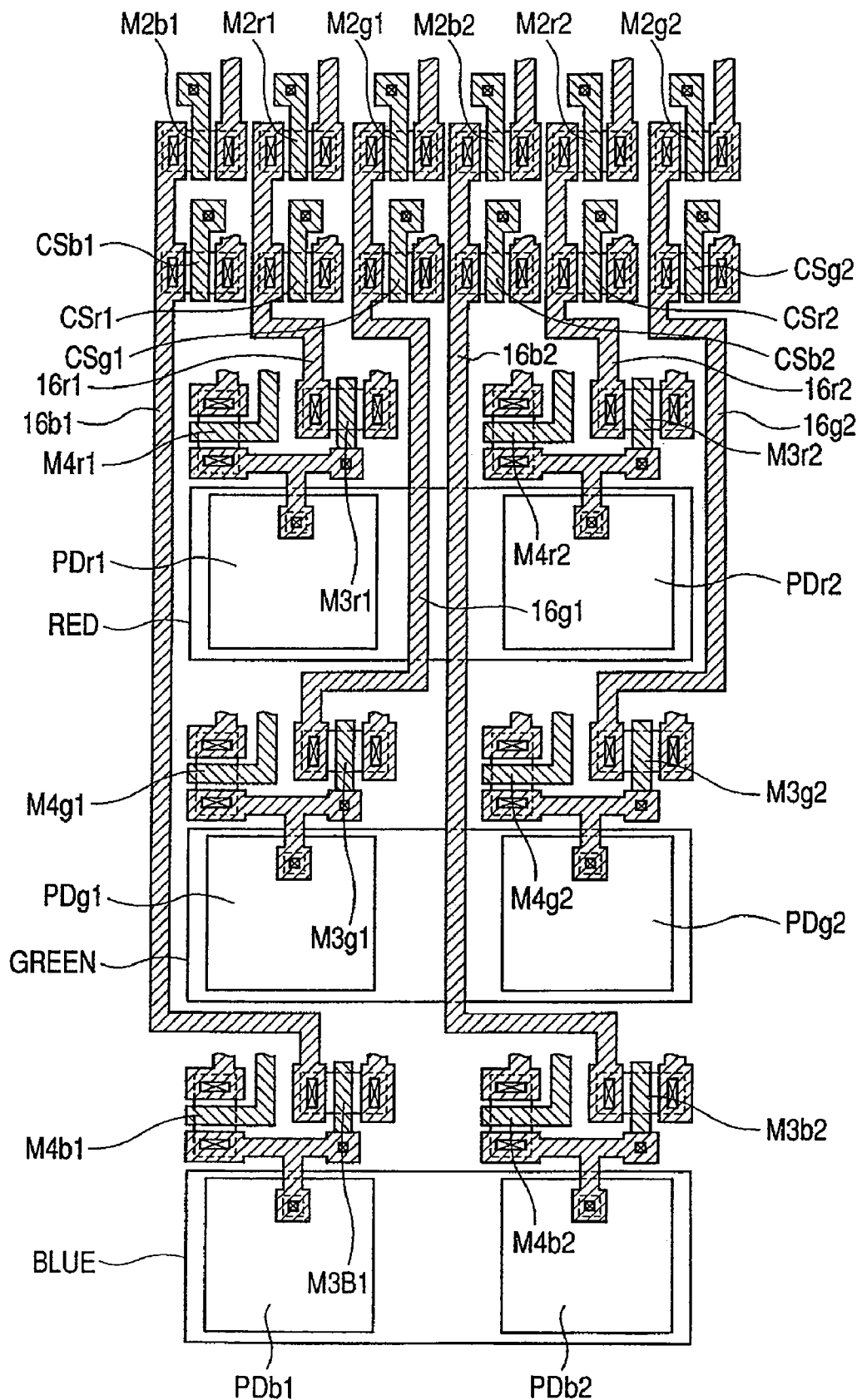
FIG. 13 shows a layout of a light receiving element, a MOS source follower constant current load (current source), and signal transfer switch.

FIG. 13 shows a layout of the light receiving element, the MOS source follower constant current load (current source), and the signal transfer switch. In the layout shown in FIG. 13, the MOS source follower constant current load is connected to the readout wiring between the signal transfer switch and each light receiving element (pixel area).

The light receiving elements r1 to b2 and the readout circuit block 3 are connected by the readout wirings 16b1, 16r1, . . . , and 16g2.

In the light receiving elements r1 to b2 shown in FIG. 1, the MOS source follower input transistors M3r1 to M3b2 performs the charge-voltage conversion to the photocarriers generated by the photoelectric conversion in the photodiodes PDr1 to PDb2. Then, the signal transfer pulse φT is changed to the high level to turn on all the signal transfer switches M2b1, M2r1, . . . , and M2g2. As a result, the light signals are collectively transferred to the storage capacitances CAPb1, CAPr1, . . . , and CAPg2 in all the pixels through the readout wirings 16b1, 16r1, . . . , and 16g2 and the signal transfer switches M2b1, M2r1, . . . , and M2g2. Then, the readout switches M1b1, M1r1, . . . , and M1g2 are sequentially turned on by the readout pulses φSR1 to φSR6 sequentially turned to the high level from the shift register 11, and the signal voltage is read out onto the common output line 14 while the capacitance is divided.

Figure 2:
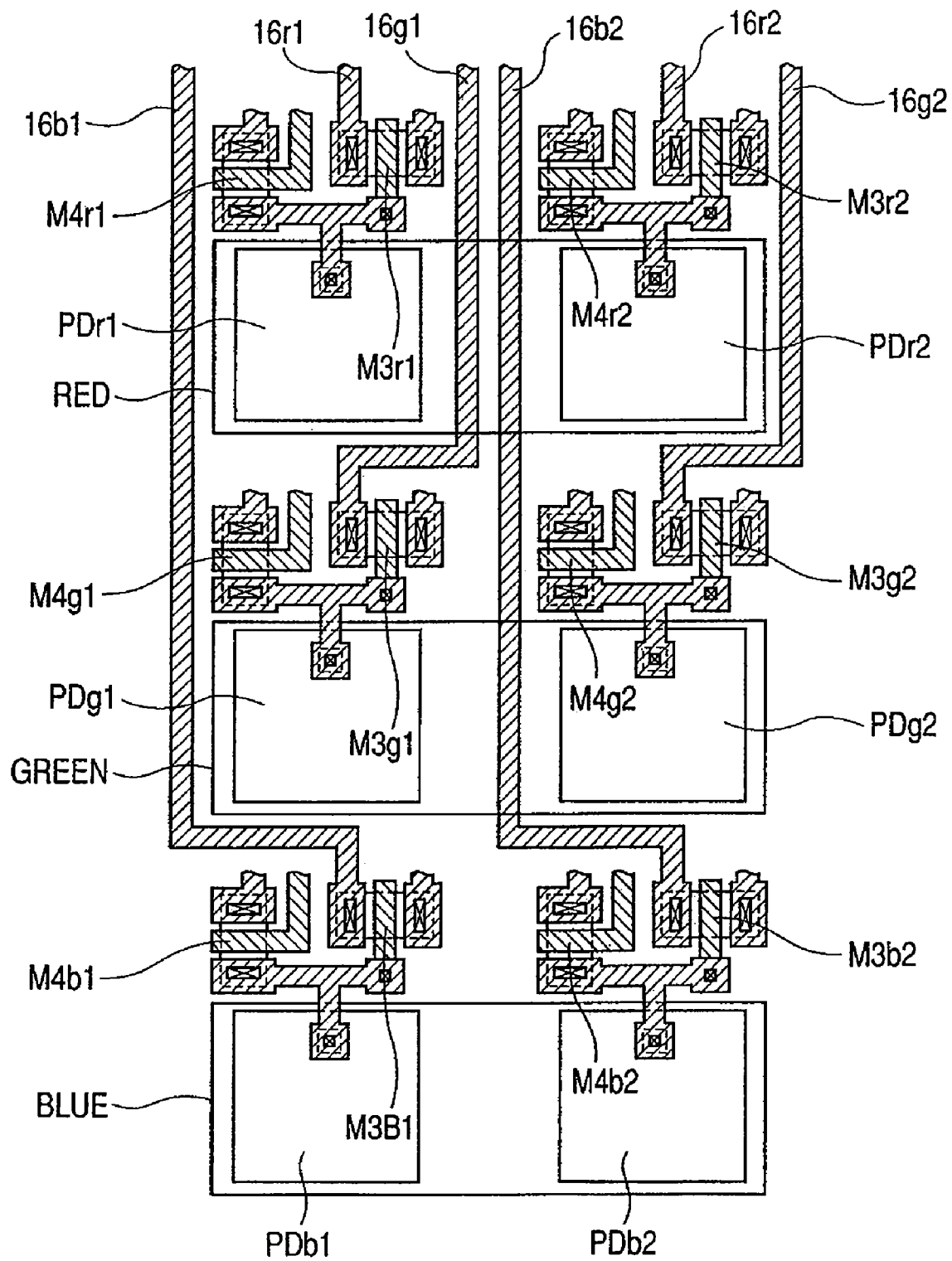
FIG. 2 is a schematic plan view showing a light receiving element in the first embodiment of the invention.

FIG. 2 is a schematic plan view showing a layout of the light receiving elements r1 to b2 of FIG. 1. The photodiodes are arrayed in three columns, and the corresponding red, green, and blue color filters (RED, GREEN, and BLUE) are formed on the photodiodes respectively.

The MOS source follower input transistors M3g1 and M3g2, and M3b1 and M3b2 and the reset switches M4g1 and M4g2, and M4b1 and M4b2 are arranged between the photodiode columns. The signals whose current are amplified by the MOS source follower input transistors are transferred to the readout circuit block 3 through the readout wirings 16g1, 16g2, 16b1, and 16b2 connected to drains (main electrodes) of the input transistors. The MOS source follower input transistors M3r1 and M3r2 and the reset switches M4r1 and M4r2 are arranged adjacent onto the side of the readout circuit block 3 of the photodiodes PDr1 and PDr2. The signals whose current are amplified by the MOS source follower input transistors M3r1 and M3r2 are transferred to the readout circuit block 3 through the readout wirings 16r1 and 16r2 connected to the drains (main electrodes) of the input transistors. From another standpoint, the first embodiment has the configuration in which the MOS source follower input transistor and the reset switch are provided adjacent onto the side of the readout circuit block 3 of the photodiodes. In the first embodiment, the MOS source follower input transistor and the reset switch are provided on the upper side (on the arrangement side of the readout circuit block 3) of the corresponding photodiodes in FIG. 2. However, the MOS source follower input transistor and the reset switch may be provided on the lower side (on the opposite side to the arrangement side of the readout circuit block 3) of the corresponding photodiodes in FIG. 2.

The pixel column is not limited to the three columns, but the first embodiment may be applied to at least two columns. The color filter is not limited to the red, green, and blue color filter. An arbitrary color filter may be arranged such that the pixel columns receive the light beams having the different wavelengths or such that the plural color filters are repeatedly arranged.

According to the first embodiment, the MOS source follower input transistor and the reset transistor are arranged adjacent to the photodiode, and the signal from the input transistor is output to the readout circuit block, which results in the following effect. That is, the difference in sensitivity caused by the difference in capacitance between the columns associated with the photodiode and the decrease in sensitivity caused by the increase in total capacitance can be suppressed.

Figure 9:
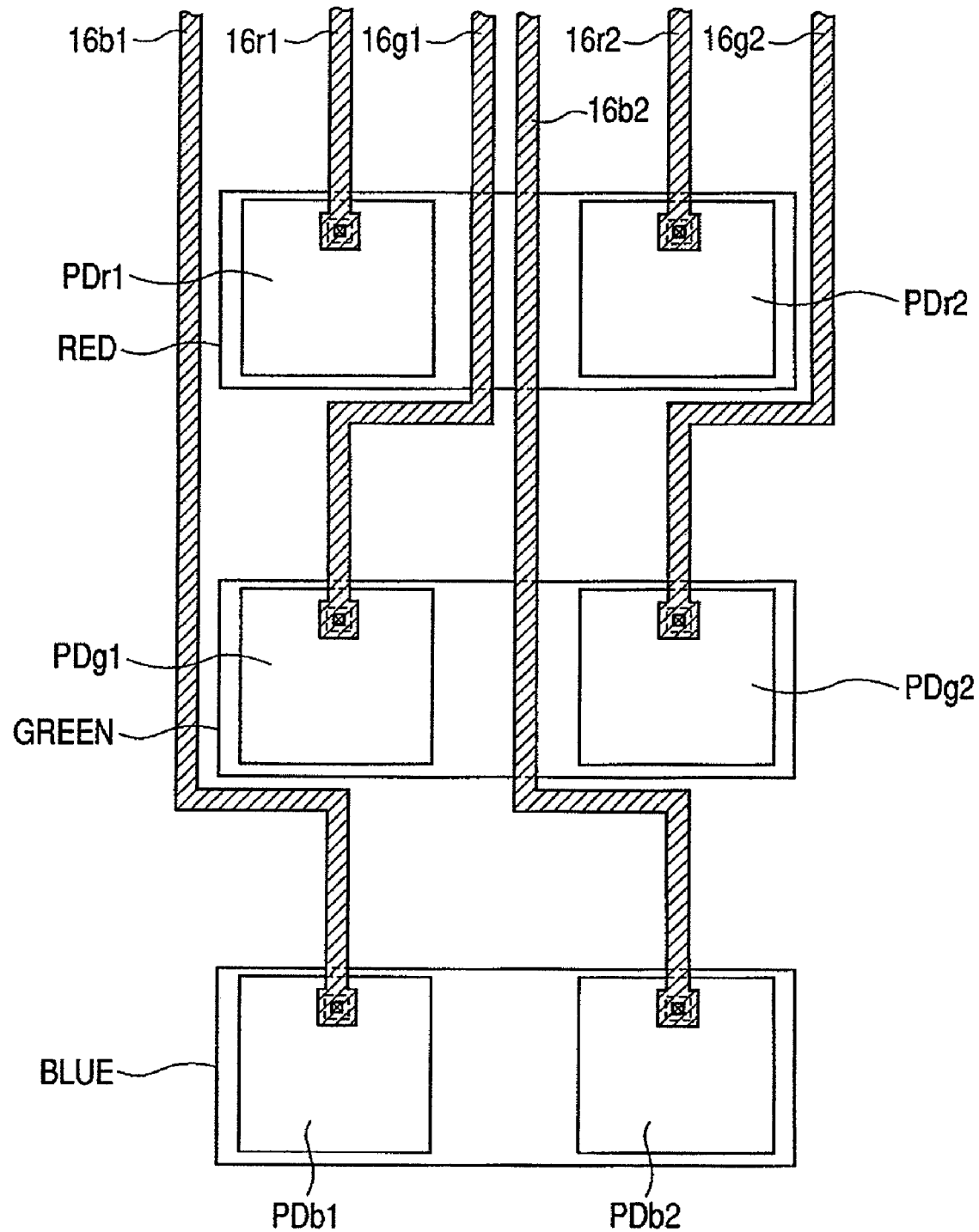
FIG. 9 is a schematic plan view showing a light receiving element in the related art.

In the first embodiment, the readout wirings 16 (for example, readout wiring 16g1 and readout wiring 16b2) are arranged adjacent to each other like the layout shown in FIG. 9. However, even if the crosstalk is temporarily generated between the readout wirings by the parasitic capacitance, the potentials of the readout wirings are finally determined by the output corresponding to the gate potential of the MOS source follower input transistor. Accordingly, even if the signals are simultaneously read out from the plural pixel columns (plural light receiving element arrays), the color mixture is not generated in the resultant readout signal.

Second Embodiment

Figure 3:
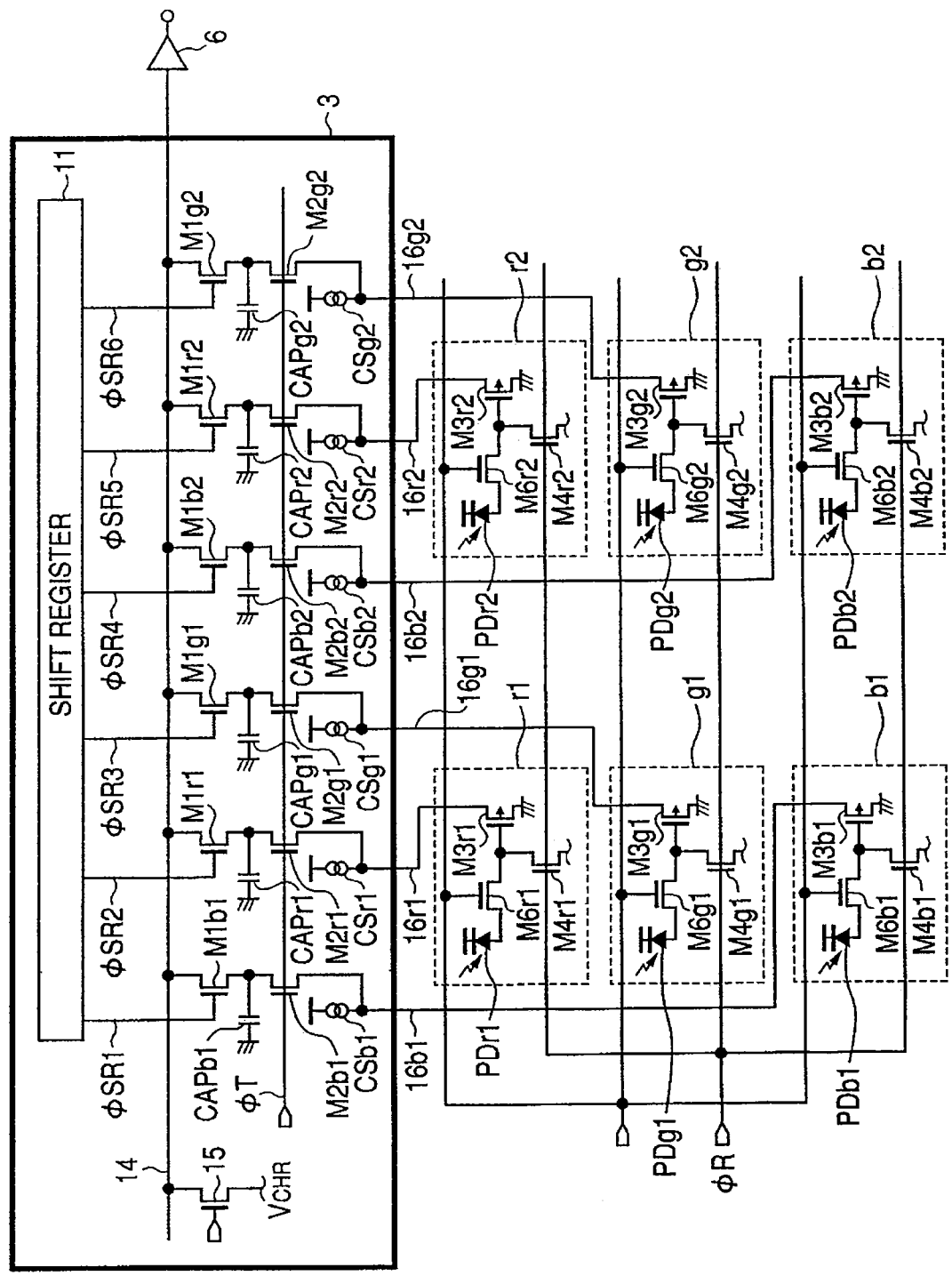
FIG. 3 is an equivalent circuit diagram showing a readout circuit block and a light receiving element according to a second embodiment of the invention.

FIG. 3 shows a configuration of a light receiving element according to a second embodiment of the invention. FIG. 3 shows an equivalent circuit corresponding to the readout circuit block 3 and light receiving element array 4 (only two-pixel-by-three-column light receiving element is shown) shown in FIG. 6. The equivalent circuit of the color image sensor in the second embodiment is similar to the equivalent circuit diagram shown in FIG. 6, and the configuration and the operation are already described, so that the description will be not repeated. In FIG. 1, the component similar to that of FIG. 8 is designated by the same reference numeral or sign.

In the second embodiment, the invention is applied to the photoelectric conversion device having a depletion transfer type pixel. In FIG. 3, second signal transfer switches M6r1 to M6b2 are collectively turned on, and the signal charges are collectively and completely depletion-transferred from the photodiodes PDr1 to PDb2 to the MOS source follower input transistors M3r1 to M3b2.

For example, the depletion transfer type pixel can be configured as disclosed in Japanese Patent Application Laid-Open Nos. H11-274454 and 2004-342836. The configuration of the depletion transfer type pixel disclosed in Japanese Patent Application Laid-Open No. 2004-342836 will be described below with reference to FIG. 12.

Figure 12:
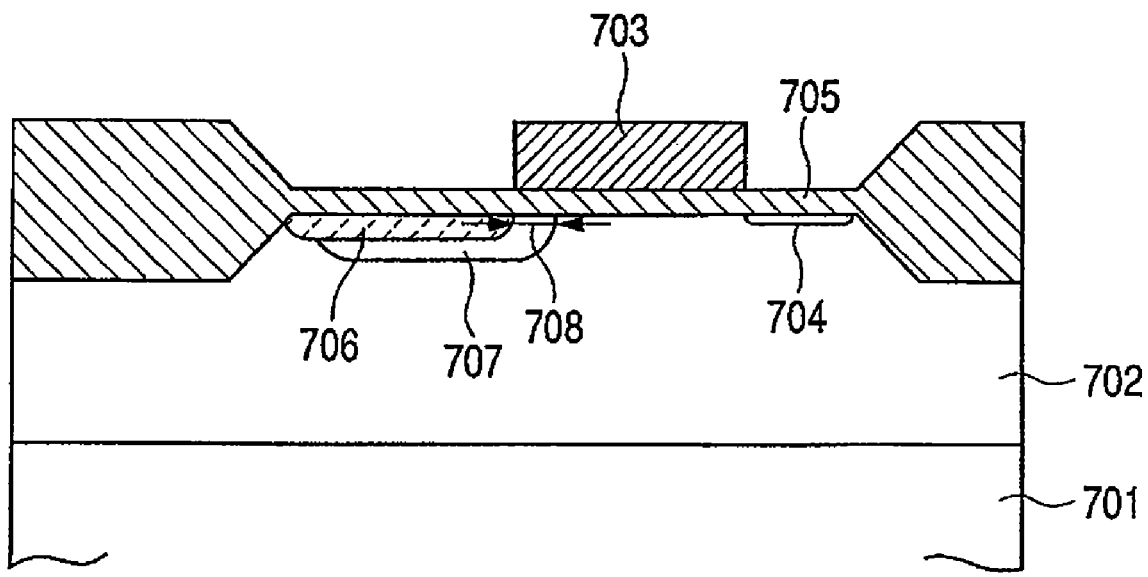
FIG. 12 is a view explaining a configuration of a depletion transfer type pixel.

Referring to FIG. 12, the reference numeral 701 denotes a semiconductor substrate, and the reference numeral 703 denotes a well formed in an image pickup area. The well 702 is made of a P-type semiconductor material. The reference numeral 703 denotes a transfer gate which transfers the signal charge stored in the pixel to a drain 704, and the reference numeral 705 denotes a gate oxide film. A storage area 707 of the photodiode is made of an N-type semiconductor material, and a surface of the storage area 707 is covered with a dense P layer 706. The formation of the dense P layer 706 can prevent the depletion layer extending from the storage area 707 from reaching the gate oxide film 705, which suppresses dark current. In such the buried photodiode, when the charge in the storage area 707 is transferred to the drain 704, it is necessary to transfer the charge from a deep place with respect to the gate oxide film 705. In order to realize the transfer of the charge from the deep place, it is necessary to form a charge transfer area 708. The gate voltage necessary to the transfer is subject to restriction of density and a width of the charge transfer area 708. That is, when the density and the width of the charge transfer area 708 can sufficiently be ensured, the charge in the photodiode can completely be transferred at the desired power supply voltage. Therefore, the photodiode can completely be reset and complete transfer of the signal charge can completely be transferred.

Generally a method of enlarging dimensions of the photodiode PD to increase a signal charge amount is adopted in order to improve the sensitivity of the photoelectric conversion device. However, this causes the problem that the sensitivity cannot sufficiently be improved because the capacitance associated with photodiode PD is increased. According to the configuration of the second embodiment, the capacitance of the input gate of the MOS source follower input transistor is designed smaller than that of the photodiode to completely depletion-transfer the signal charge to the input gate of the MOS source follower input transistor, which allows the sensitivity to be improved.

Figure 4:
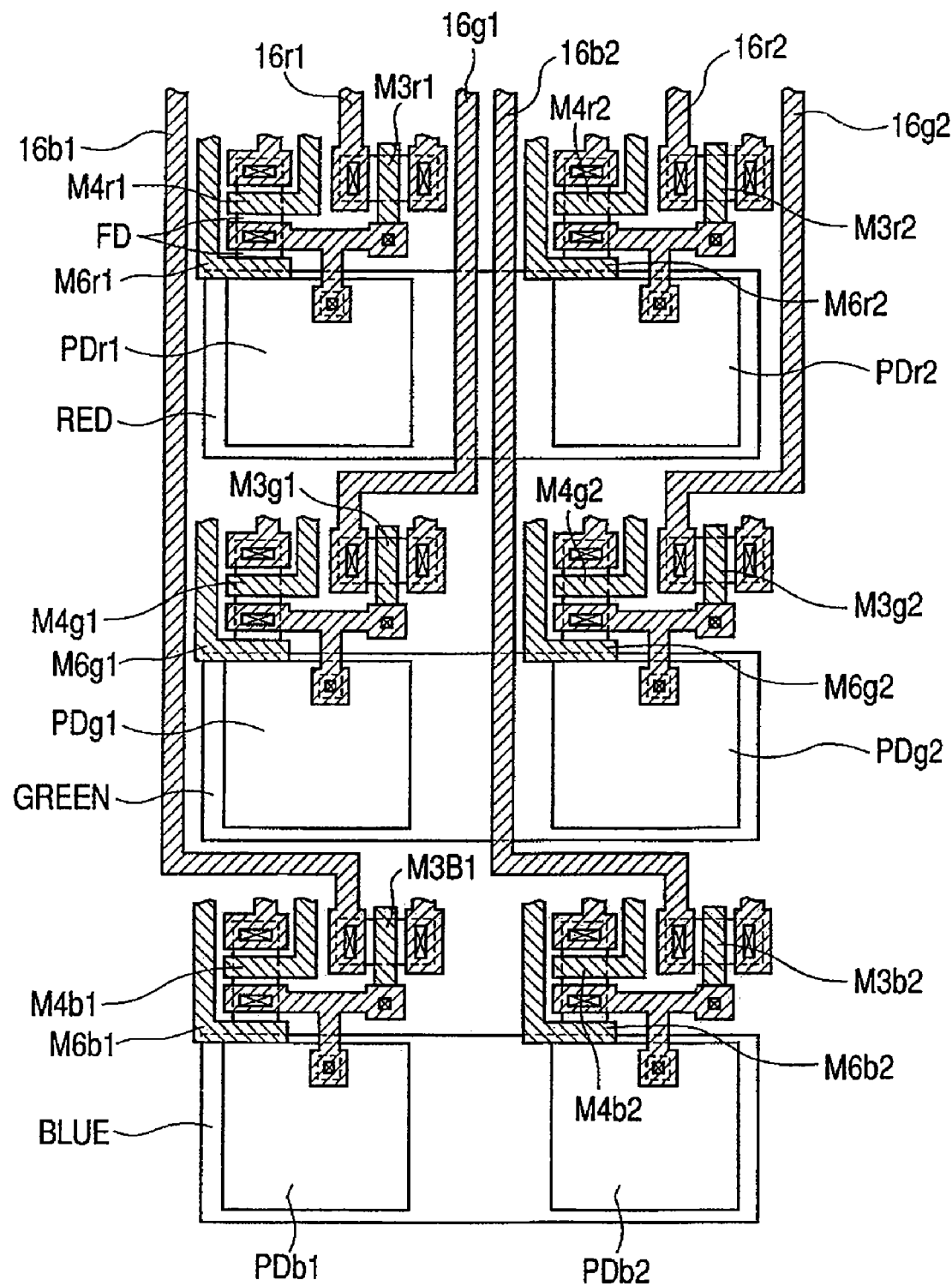
FIG. 4 is a schematic plan view showing a light receiving element in the second embodiment of the invention.

FIG. 4 is a schematic plan view showing a layout of the light receiving elements r1 to b2 of FIG. 3. The photodiodes are arrayed in three columns, and the corresponding red, green, and blue color filters (RED, GREEN, and BLUE) are formed on the photodiodes respectively. The MOS source follower input transistors M3g1 and M3g2, and M3b1 and M3b2, the reset switches M4g1 and M4g2, and M4b1 and M4b2 and the second signal transfer switches M6g1 and M6g2, and M6b1 and M6b2 are arranged between the photodiode columns. The signals whose current are amplified by the MOS source follower input transistors M3g1 and M3g2, and M3b1 and M3b2 are transferred to the readout circuit block 3 through the readout wirings 16g1, 16g2, 16b1, and 16b2 connected to the drains (main electrodes) of the input transistors. In FIG. 4, the drain areas of the second signal transfer switches (transfer transistors) and the drain areas of the reset switches are formed in the same semiconductor diffusion areas. The semiconductor diffusion area becomes a floating diffusion portion (FD portion) which receives the signal from the photodiode.

The second signal transfer switches M6$r$1 and M6$r$2, the MOS source follower input transistors M3$r$1 and M3$r$2, and the reset switches M4$r$1 and M4$r$2 are arranged adjacent onto the side of the readout circuit block 3 of the photodiodes PDr1 and PDr2. The signals whose current are amplified by the MOS source follower input transistors M3$r$1 and M3$r$2 are transferred to the readout circuit block 3 through the readout wirings 16$r$1 and 16$r$2 connected to the drains (main electrodes) of the input transistors.

From another standpoint, the second embodiment has the configuration in which the second signal transfer switch, the MOS source follower input transistor, and the reset switch are provided adjacent onto the side of the readout circuit block 3 of the photodiodes. In the second embodiment, the second signal transfer switch, the MOS source follower input transistor, and the reset switch are provided on the upper side (on the arrangement side of the readout circuit block 3) of the corresponding photodiodes in FIG. 4. However, the second signal transfer switch, the MOS source follower input transistor, and the reset switch may be provided on the lower side (on the opposite side to the arrangement side of the readout circuit block 3) of the corresponding photodiodes in FIG. 4.

The pixel column is not limited to the three columns, but the first embodiment may be applied to at least two columns. The color filter is not limited to the red, green, and blue color filter. An arbitrary color filter may be arranged such that the pixel columns receive the light beams having the different wavelengths or such that the plural color filters are repeatedly arranged.

According to the second embodiment, the MOS source follower input transistor and the reset transistor are arranged adjacent to the photodiode, and the signal from the input transistor is output to the readout circuit block. Therefore, the difference in sensitivity caused by the difference in capacitance between the columns associated with the photodiode and the decrease in sensitivity caused by the increase in total capacitance can be suppressed.

In the second embodiment, the readout wirings 16 (for example, readout wiring 16$g$1 and readout wiring 16$b$2) are arranged adjacent to each other like the layout shown in FIG. 9. However, even if the crosstalk is temporarily generated between the readout wirings by the parasitic capacitance, the potentials of the readout wirings are finally determined by the output corresponding to the gate potential of the MOS source follower input transistor. Accordingly, even if the signals are simultaneously read out from the plural pixel columns (plural light receiving element arrays), the color mixture is not generated in the resultant readout signal.

Third Embodiment

Figure 5:
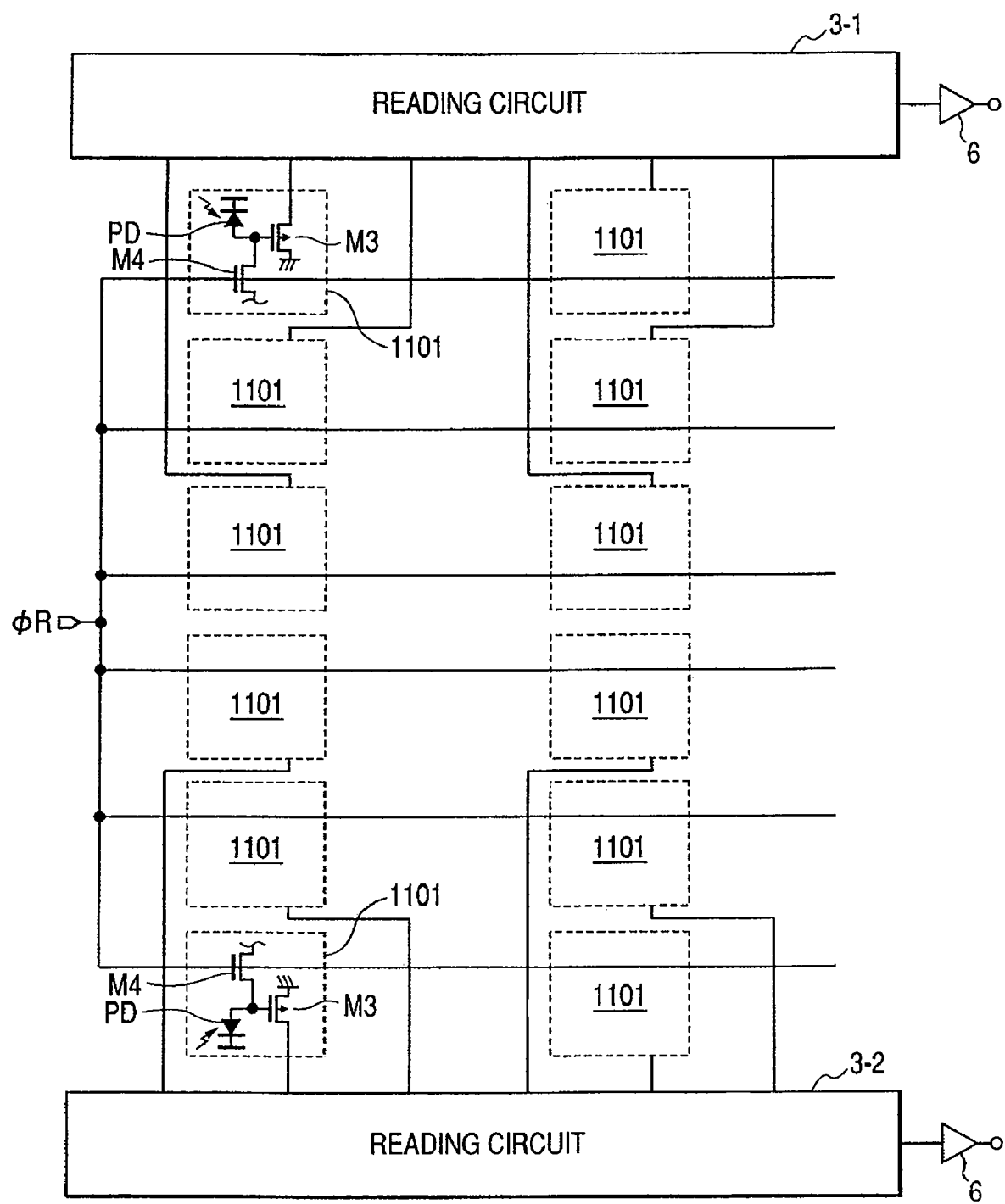
FIG. 5 is an equivalent circuit diagram showing a readout circuit block and a light receiving element according to a third embodiment of the invention.

FIG. 5 shows a photoelectric conversion device according to a third embodiment of the invention. The six-column light receiving element is configured so as to output the light signals while the six-column light receiving element is divided into each three columns of upper and lower portions. The reference numeral 1101 denotes a light receiving element, the reference numerals 3-1 and 3-2 designate a readout circuit block, and the reference numeral 6 denotes a signal output amplifier. The three-column light receiving element column is described in the first and second embodiments. However, as the number of pixel columns is increased as shown in FIG. 5, the number of readout wirings 16 running between the light receiving elements is increased. Therefore, it is necessary to secure the wiring area by decreasing an aperture area of the photodiode, which decreases the sensitivity. However, in the third embodiment, even if the number of light receiving element columns doubles the first and second embodiments, the same aperture area of the photodiode and the same sensitivity as the first and second embodiments can be obtained without losing the effect of the invention by vertically dividing the readout wirings.

The third embodiment is applied to the photoelectric conversion device and multichip module type image sensor on which the color filter is mounted. However, the invention is not limited to the third embodiment. When the signals are simultaneously read out from the plural pixel columns (plural light receiving element arrays) while the wirings are arranged adjacent to each other, the crosstalk is generated even in the sensor which reads the monochrome image. When the invention is applied to the monochrome image reading sensor, the invention also obtains the effect that the decrease in image contrast is prevented.

In the invention, the readout wirings 16 running from the light receiving elements can be formed in the interconnect layer during the same process in producing the semiconductor device. The invention is not limited to the above process. For example, in FIG. 9, the wirings 16$g$1 and 16$g$2 from the photodiodes on which the GREEN filter is formed and the wirings 16$b$1 and 16$b$2 from the photodiodes on which the BLUE filter is formed may be formed in the different process in producing the semiconductor device. In this case, the crosstalk cannot be neglected when the wirings are arranged adjacent to each other. Therefore, the invention is effective even in this case.

Figure 6:
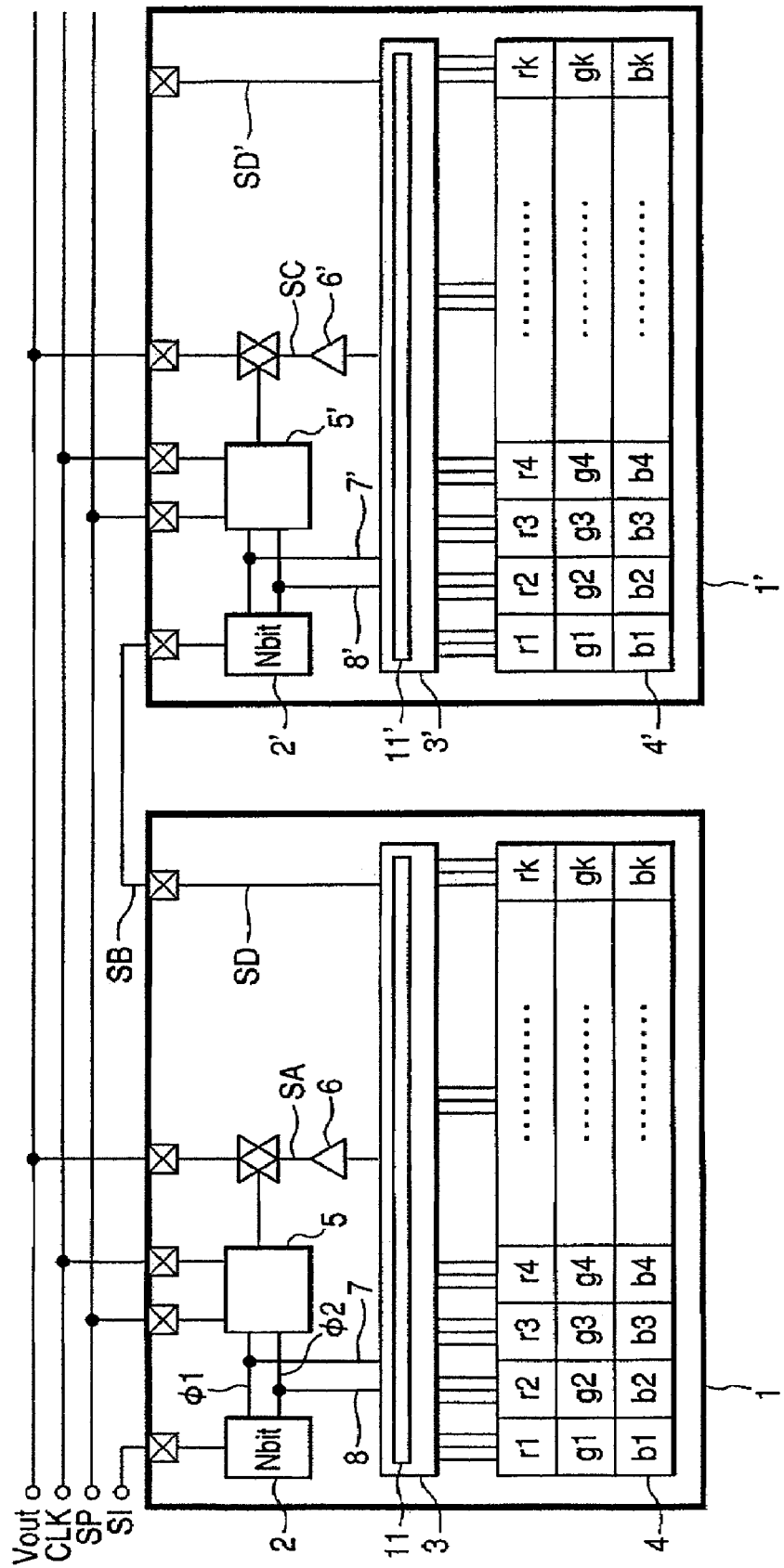
FIG. 6 is an equivalent circuit diagram showing an image sensor chip in the related art.
Figure 7:
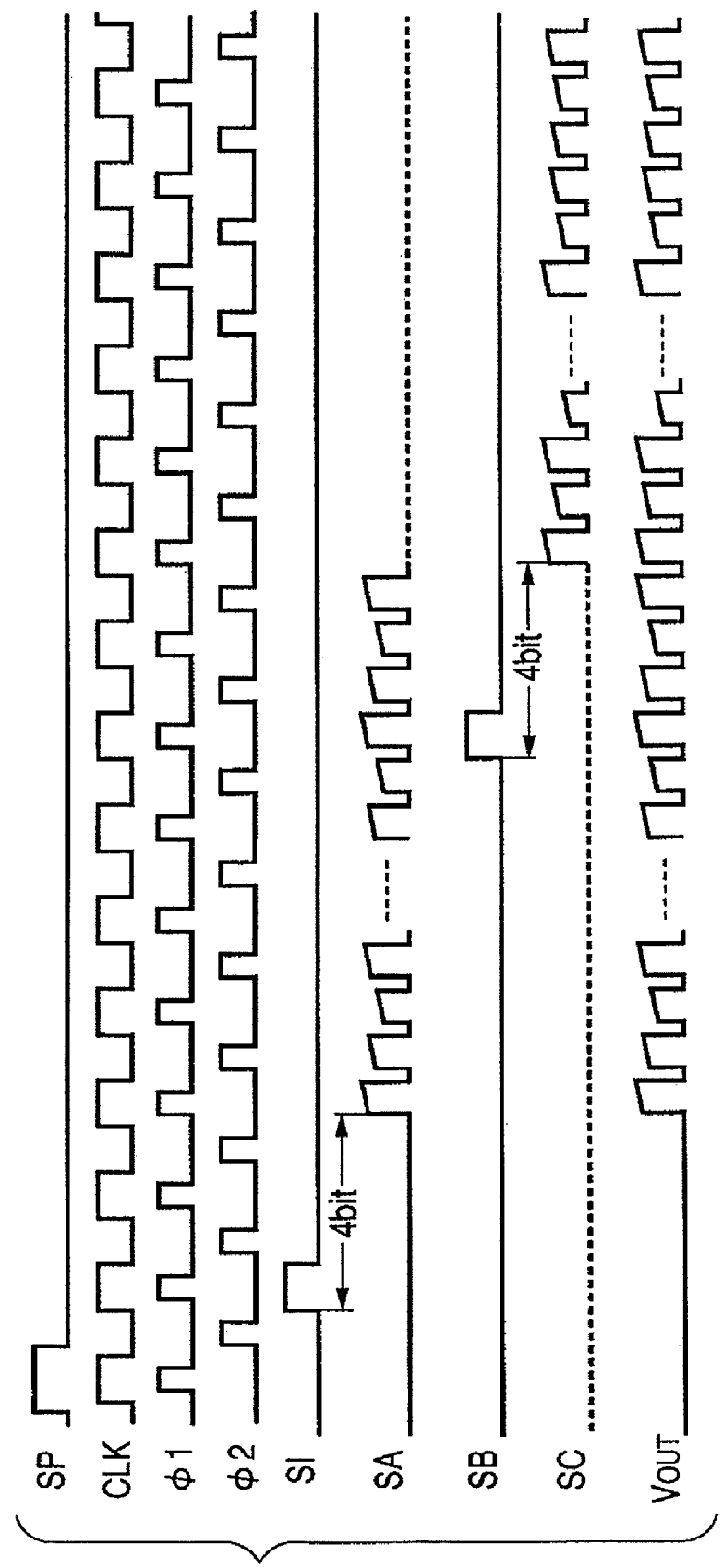
FIG. 7 shows a timing chart in the related art.

In the case of the multichip module type image sensor, there is the restriction that the photodiode is arranged to the edge portion of each photoelectric conversion device to minimize a distance to the photodiode in the adjacent photoelectric conversion device. Therefore, because it is necessary that the number of wirings cutting across the pixel column portion be decreased as much as possible, as shown in FIG. 6, the readout circuits are collectively arranged on the upper side of the light receiving element columns when the light receiving element columns are arranged close to the lower chip end. In this case, because it is necessary that the signal lines from the three light receiving element columns of FIG. 6 are naturally drawn onto the upper side, an undesirable arrangement where the wirings are adjacent to each other cannot be avoided. However, according to the invention, the crosstalk problem is not generated even if the wirings are arranged adjacent to each other. Accordingly, the photoelectric conversion device in which the signals are simultaneously read out from the plural light receiving element columns can be realized without changing the optimum black arrangement in the photoelectric conversion device used for the conventional multichip module type image sensor.

Fourth Embodiment

An embodiment of the case where the multichip module type image sensor, in which the photoelectric conversion device of the invention is used, is applied to a sheet-feed type original image recording apparatus will be described in detail with reference to FIGS. 10 and 11.

Figure 10:
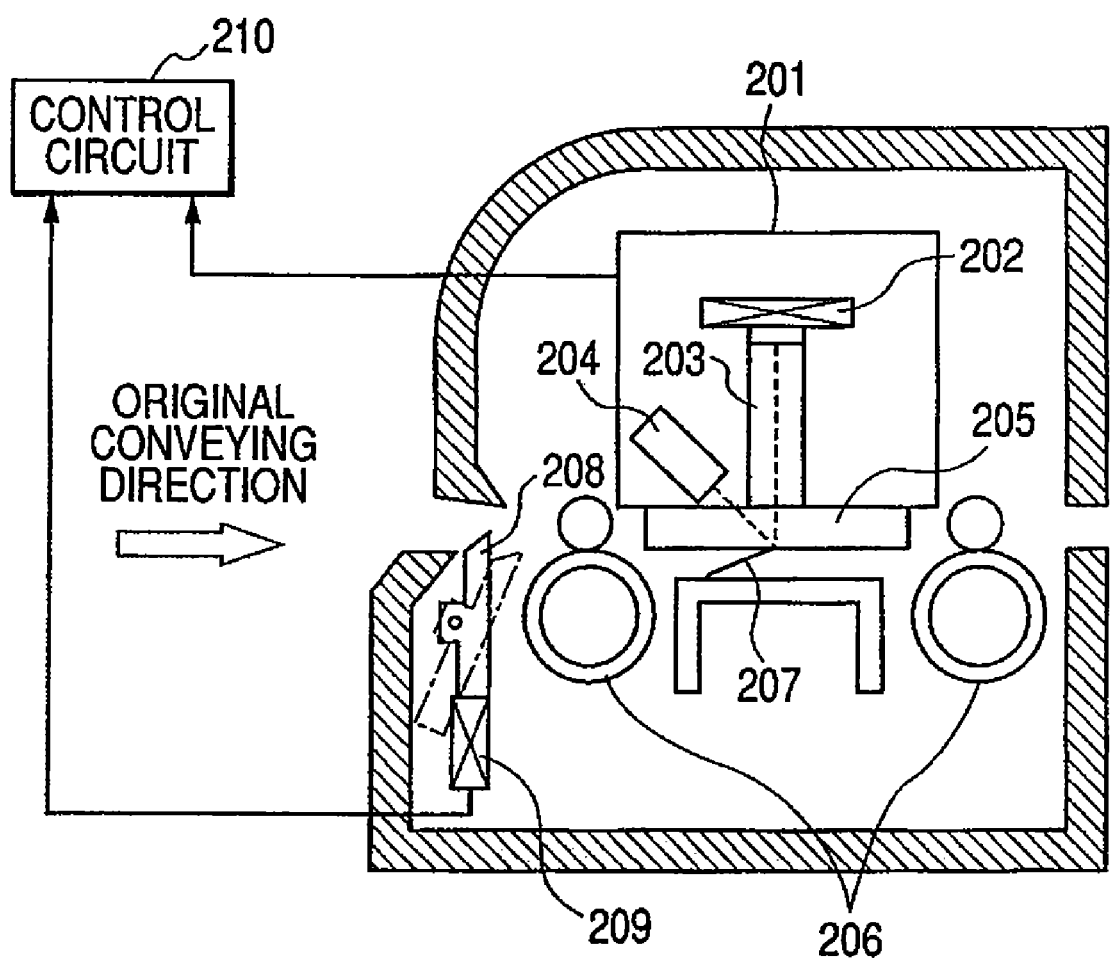
FIG. 10 is a schematic view showing an original image scanner which reads an original image.

FIG. 10 is a schematic view showing an original image scanner which reads an original image.

The reference numeral 201 denotes a contact image sensor (hereinafter also referred to as "CIS"). The CIS 201 includes a multichip module type image sensor (photoelectric conversion device) 202, a SELFOC lens 203, an LED array 204, and a contact glass 205.

The CIS 201 is arranged between conveyance rollers 206, and the conveyance rollers 206 are used to arrange the original. A contact sheet 207 is used to bring the original into contact with the CIS 201. The reference numeral 210 denotes a control circuit which performs signal processing from the CIS 201.

An original detection lever 208 detects the original inserting into the original image scanner. When the original detection lever 208 detects the original inserting into the original image scanner, the output of the original detection sensor 209 is changed by inclination of the original detection lever 208. When the inclined state of the original detection lever 208 is transmitted to a CPU 315 (see FIG. 11) in the control circuit 210, the CPU 315 determined that the original is inserted, and the CPU 315 drives a drive motor (not shown) for the original conveyance rollers 206. Then, the original is conveyed to perform the reading operation.

Figure 11:
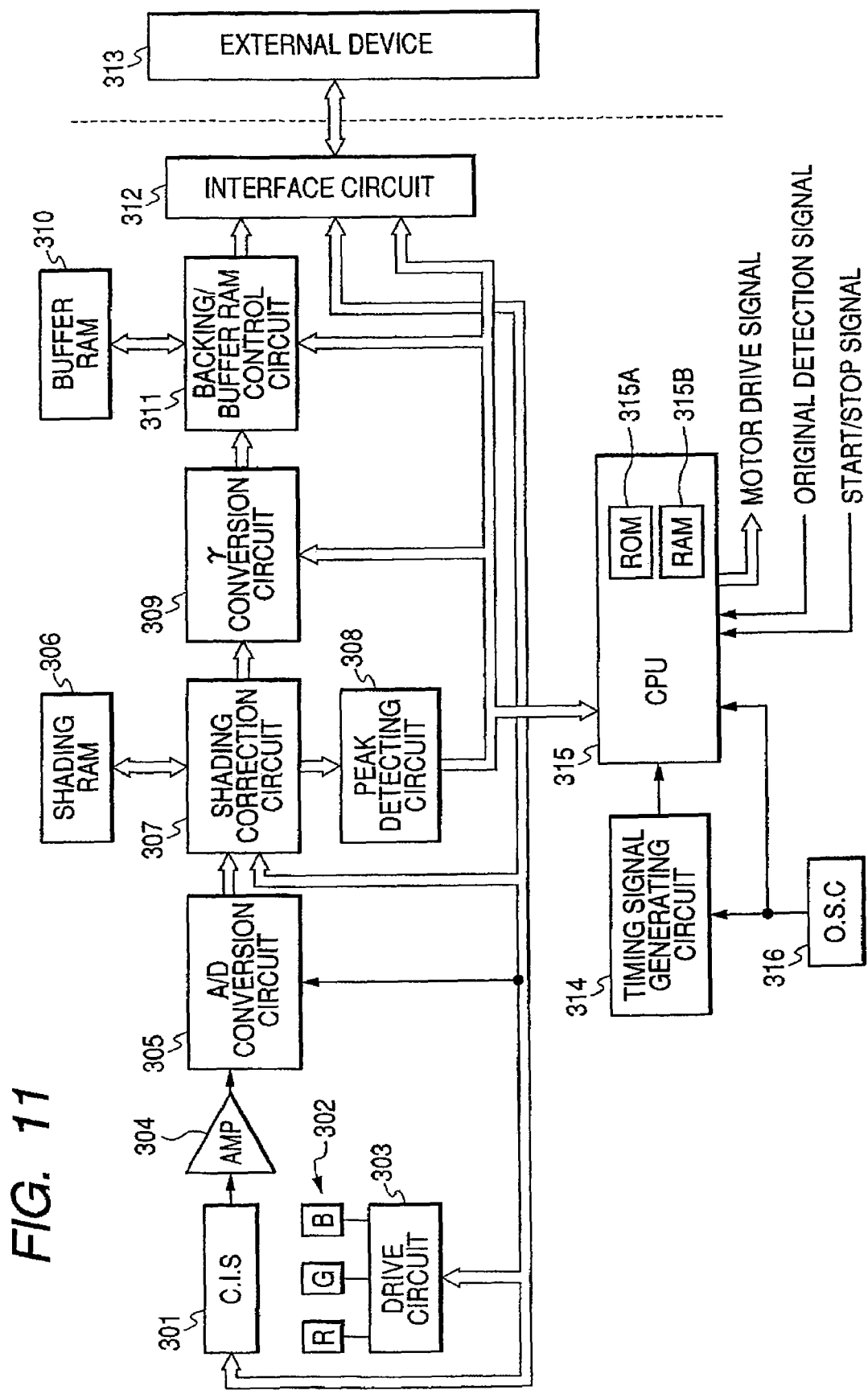
FIG. 11 is a block diagram showing an electric configuration in order to describe a control circuit 210 of FIG. 10 in detail.

FIG. 11 is a block diagram showing an electric configuration in order to describe the control circuit 210 of FIG. 10 in detail. A circuit operation of the control circuit 210 will be described with reference to FIG. 11. In FIG. 11, the reference numeral 301 denotes a contact image sensor (CIS 201 of FIG. 10). R, G, and B LEDs 302 which are of the light source are integrated with the contact image sensor 301. R, G, and B LEDs 302 are changed and lit in each line by an LED control (drive) circuit 303 while the original is conveyed on the contact glass 205 of the CIS 201 shown in FIG. 10, which enables the color image to be read in the order of R, G, and B lines.

An AMP 304 is an amplifier which amplifies the signal output from the CIS 301. The reference numeral 305 denotes an A/D converter which obtains, e.g., eight-bit digital output by performing A/D conversion. Shading correction data is stored in a shading RAM 306 by previously reading a calibration sheet. A shading correction circuit 307 performs shading correction of the read image signal based on the shading correction data stored in the shading RAM 306. A peak detection circuit 308 detects a peak value in the read image data in each line, and the peak detection circuit 308 is also used to detect a front end of the original.

A gamma conversion circuit 309 performs gamma conversion of the read image data according to a gamma curve previously set by a host computer.

A buffer RAM 310 is one in which the image data is temporarily stored in order to synchronize the actual reading operation with timing of communication with the host computer. A packing/buffer RAM control circuit 311 performs a packing process according to an image output mode (binary, four-bit multi level, eight-bit multi level, and 24-bit multi level) previously set by the host computer. Then, a process of writing the data in the buffer RAM 310 and a process of reading the image data into an interface circuit 312 from the buffer RAM 310 are performed.

The interface circuit 312 is located between the image scanner according to the fourth embodiment and an external device which is of the host device such as a personal computer. The interface circuit 312 receives the control signal and outputs the image signal.

The reference numeral 315 denotes, e.g., the CPU which is formed in a microcomputer. The CPU 315 has a ROM 315A in which a processing procedure is stored and a working RAM 315B, and the CPU 315 controls each unit according to the procedure stored in the ROM 315A.

The reference numeral 316 denotes, e.g., a crystal oscillator, and the reference numeral 314 denotes a timing signal generation circuit which divides the output frequency of the oscillator 316 according to the setting of the CPU 315 to generate various timing signals which are of a reference of the operation. The reference numeral 313 denotes an external device which is connected to the control circuit through the interface circuit 312. An example of the external device includes the personal computer.

The invention is applied to the image sensor chip in which the plural pixel columns, in which the plural pixels are arrayed, are arranged and the independent readout wiring is individually provided for each pixel, and the multichip module type image sensor, contact image sensor, and mage scanner in which the image sensor chip is used.

This application claims priority from Japanese Patent Application No. 2005-021448 filed on Jan. 28, 2005, which is hereby incorporated by reference herein.

What is claimed is:

1. A photoelectric conversion device comprising: a plurality of pixel columns each including a plurality of pixels, each pixel including:
   a photoelectric conversion element,
   a reset transistor for resetting a signal generated in the photoelectric conversion element, and
   a source follower input transistor for amplifying the signal generated in the photoelectric conversion element; and
   a plurality of readout wirings, the plurality of readout wirings being connected to the plurality of pixels and a plurality of readout transistors of a readout circuit in a respective manner, with each readout wiring connecting a corresponding readout transistor to a corresponding pixel separately from other pixels of the plurality of pixels in order to read out a signal from the corresponding pixel independently from the other pixels, the signal being read out into the readout circuit, with each of the plurality of readout wirings being separately connected to the readout circuit, such that signals from a plurality of pixels in one of the plurality of pixel columns and signals from a plurality of pixels in another one of the plurality of pixel columns are read out approximately at a simultaneous timing via the plurality of readout wirings into the readout circuit,
   wherein the reset transistor and the source follower input transistor are arranged between a photoelectric conversion element in a first pixel column and a photoelectric conversion column in a second pixel column arranged adjacent to the first pixel column, with the reset transistor and the source follower input transistor being included in the first pixel column or the second pixel column.

2. A photoelectric conversion device according to claim 1, wherein a readout wiring is connected to a main electrode of the source follower input transistor.

3. A photoelectric conversion device according to claim 1, wherein at least two of the plurality of readout wirings are operated to read out signals from different pixels in a same pixel column and are arranged adjacent to each other.

4. A photoelectric conversion device according to claim 1, wherein pixels in a pixel column receive light beams having different wavelengths.

5. A photoelectric conversion device according to claim 1, wherein the photoelectric conversion device is incorporated in a multichip module type image sensor that includes a plurality of such photoelectric conversion devices arranged in a column manner such that edge portions of the plurality of photoelectric conversion devices are arranged adjacent to each other.

6. A photoelectric conversion device according to claim 5, wherein the multichip module type image sensor is incorporated in a contact image sensor that includes:
    a light source, which emits light to a substance to be read; and
    an optical system, which introduces light from the substance to be read to the multichip module type image sensor.

7. A photoelectric conversion device according to claim 6, wherein the contact image sensor is incorporated in an image scanner that includes a roller, which conveys an original to the contact image sensor, the original being of the substance to be read.

8. A photoelectric conversion device comprising:
    a plurality of pixel columns each including a plurality of pixels, each pixel including:
    a photoelectric conversion element,
    a reset transistor for resetting a signal generated in the photoelectric conversion element,
    a source follower input transistor for amplifying the signal generated in the photoelectric conversion element,
    a floating diffusion region connected to a gate of the source follower input transistor, and
    a transfer transistor for transferring the signal from the photoelectric conversion element to the floating diffusion region; and
    a plurality of readout wirings, the plurality of readout wirings being connected to the plurality of pixels and a plurality of readout transistors of a readout circuit in a respective manner, with each readout wiring connecting a corresponding readout transistor to a corresponding pixel separately from other pixels of the plurality of pixels in order to read out a signal from the corresponding pixel independently from the other pixels, the signal being read out into the readout circuit, with each of the plurality of readout wirings being separately connected to the readout circuit, such that signals from a plurality of pixels in one of the plurality of pixel columns and signals from a plurality of pixels in another one of the plurality of pixel columns are read out approximately at a simultaneous timing via the plurality of readout wirings into the readout circuit,
    wherein a transfer transistor, a floating diffusion region, a reset transistor, and a source follower input transistor included in a first pixel column or a second pixel column are arranged between a photoelectric conversion element in the first pixel column and a photoelectric conversion element in the second pixel column arranged adjacent to the first pixel column.

* * * * *